United States Patent
Dallabora et al.

[11] Patent Number: 5,999,450
[45] Date of Patent: Dec. 7, 1999

[54] ELECTRICALLY ERASABLE AND PROGRAMMABLE NON-VOLATILE MEMORY DEVICE WITH TESTABLE REDUNDANCY CIRCUITS

[75] Inventors: Marco Dallabora, Carpiano; Corrado Villa, Sovico; Marco Defendi, Sulbiate, all of Italy

[73] Assignee: STMicroelectronics s.r.l., Agrate Brianza, Italy

[21] Appl. No.: 08/853,756

[22] Filed: May 8, 1997

[30] Foreign Application Priority Data

May 9, 1996 [EP] European Pat. Off. ............. 96830267

[51] Int. Cl.$^6$ .................................................. G11C 16/06
[52] U.S. Cl. ............................... 365/185.09; 365/185.08; 365/185.11; 365/200
[58] Field of Search .......................... 365/185.09, 185.11, 365/185.08, 200, 201

[56] References Cited

U.S. PATENT DOCUMENTS

| | | | |
|---|---|---|---|
| 5,327,382 | 7/1994 | Seno et al. | 365/210 |
| 5,349,558 | 9/1994 | Cleveland et al. | 365/200 |
| 5,381,371 | 1/1995 | Haraguchi | 365/200 |
| 5,388,083 | 2/1995 | Assar et al. | 365/218 |
| 5,485,595 | 1/1996 | Assar et al. | 395/430 |
| 5,532,963 | 7/1996 | Kushiyama et al. | 365/201 |
| 5,636,168 | 6/1997 | Oyama | 365/201 |
| 5,708,601 | 1/1998 | McKenny et al. | 365/185.09 |

FOREIGN PATENT DOCUMENTS

| | | |
|---|---|---|
| 0 637 034 A1 | 7/1993 | European Pat. Off. . |
| WO 84/04196 | 2/1984 | WIPO . |
| WO 95/09424 | 9/1993 | WIPO . |

*Primary Examiner*—David Nelms
*Assistant Examiner*—Hien Nguyen
*Attorney, Agent, or Firm*—David V. Carlson; E. Russell Tarleton; Seed and Berry LLP

[57] ABSTRACT

An electrically erasable and programmable non-volatile memory device comprises at least one memory sector comprising an array of memory cells arranged in rows and first-level columns, the first-level columns being grouped together in groups of first-level columns each coupled to a respective second-level column, first-level selection means for selectively coupling one first-level column for each group to the respective second-level column, second-level selection means for selecting one of the second-level columns, first direct memory access test means activatable in a first test mode for directly coupling a selected memory cell of the array to a respective output terminal of the memory device, redundancy columns of redundancy memory cells for replacing defective columns of memory cells, and a redundancy control circuit comprising defective-address storage means for storing addresses of the defective columns and activating respective redundancy columns when the defective columns are addressed. The redundancy control circuit comprises second direct memory access test means activatable in a second test mode together with the first direct memory access test means for directly coupling memory elements of the defective-address storage means to respective second-level columns of the array, whereby the memory elements of the defective-address storage means can be directly coupled to output terminals of the memory device.

19 Claims, 8 Drawing Sheets

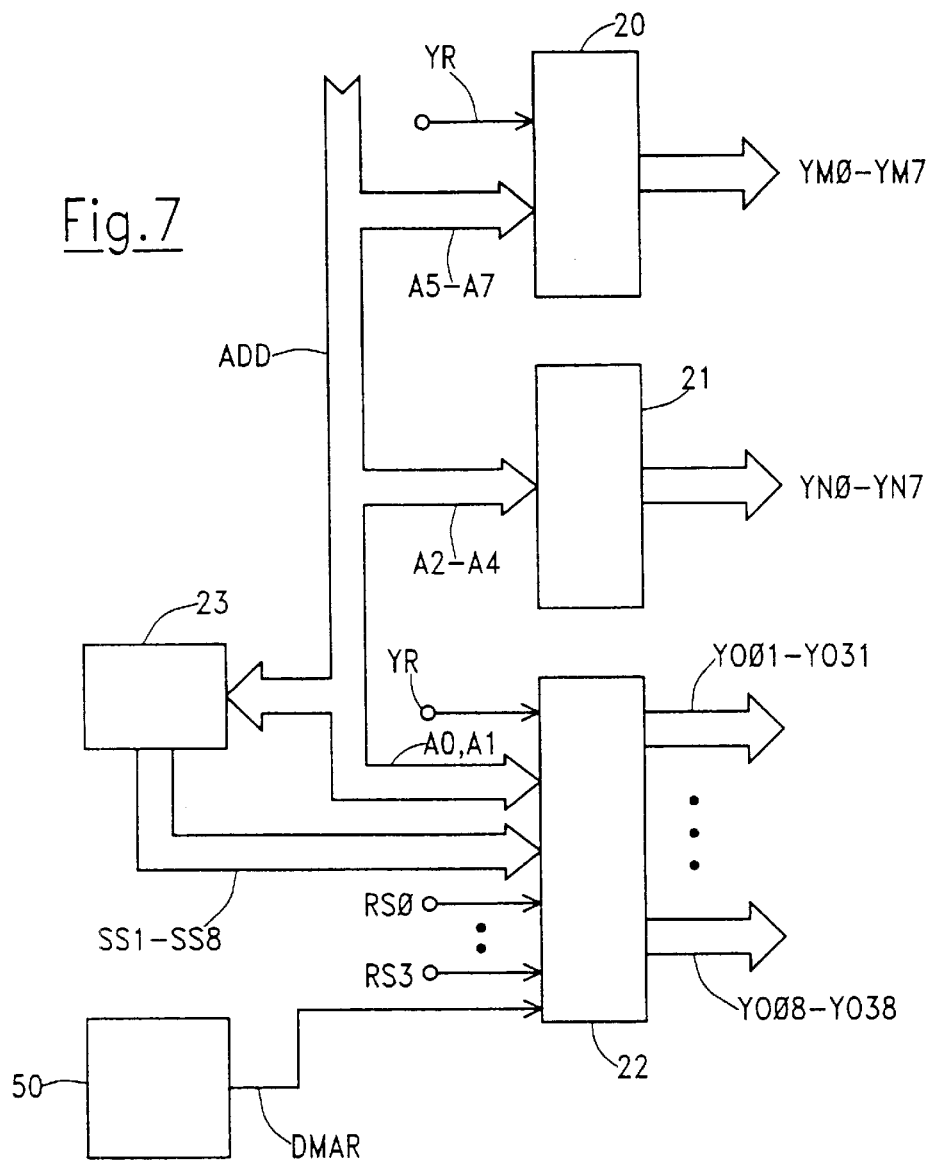
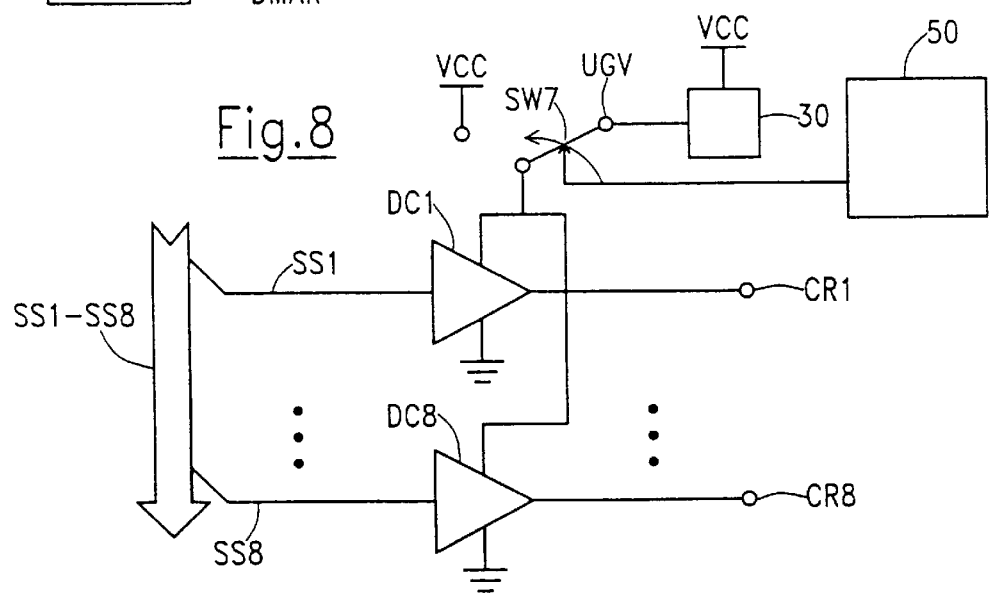

ELECTRICALLY ERASABLE AND PROGRAMMABLE NON-VOLATILE MEMORY DEVICE WITH TESTABLE REDUNDANCY CIRCUITS

TECHNICAL FIELD

The present invention relates to an electrically erasable and programmable non-volatile memory device, particularly to a Flash EEPROM with testable redundancy circuits.

BACKGROUND OF THE INVENTION

In semiconductor memories, redundancy refers to the complexity of circuits and additional memory elements provided in the memory device to "repair" defective memory elements. By means of redundancy, a memory device affected by at most a limited number of defects can be recovered.

Redundancy memory elements are formed by memory cells identical to the memory cells of the memory matrix, and are arranged in rows (redundancy row) or columns (redundancy columns). The redundancy circuits control the selection of a given redundancy row or redundancy column in substitution for a defective row or column of the memory matrix, i.e., a row or column in which at least one defective memory cell is detected. To this purpose, the redundancy circuits comprise non-volatile memory registers to store addresses of the defective rows or columns, so that when the defective rows or columns are accessed (during reading or programming) they are not selected, and the corresponding redundancy rows or redundancy columns are instead selected.

The provision of redundancy in a memory device clearly has a cost in terms of chip area. The number of redundancy memory elements (redundancy rows or columns) to be provided must be evaluated on the basis of the overall yield, taking into account the degree of defectivity of the manufacturing process and the number of defective memory device chips which can be recovered thanks to the provision of redundancy.

The functional substitution of defective rows or columns with redundancy ones is performed during the in-factory testing of the memory device, and is normally transparent to the end user.

It is useful to have the possibility of testing the redundancy circuits. This is necessary to verify the complete functionality of the redundancy circuits, for example to ascertain that the non-volatile memory registers which must store the defective addresses are free of errors. Testing of the redundancy circuits is also necessary to extrapolate statistic informations on the degree of defectivity of the manufacturing process, so that the number of redundancy memory elements can be adjusted to attain the maximum process yield.

SUMMARY OF THE INVENTION

In view of the state of the art described, it is an object of the present invention to provide an electrically erasable and programmable non-volatile memory device with testable redundancy circuits.

According to the present invention, such objects are achieved by means of an electrically erasable and programmable non-volatile memory device, comprising at least one memory sector comprising an array of memory cells arranged in rows and first-level columns, the first-level columns being grouped together in groups of first-level columns each coupled to a respective second-level column, first-level selection means for selectively coupling one first-level column for each group to the respective second-level column, second-level selection means for selecting one of the second-level columns, first direct memory access test means activatable in a first test mode for directly coupling a selected memory cell of the array to a respective output terminal of the memory device, redundancy columns of redundancy memory cells for replacing defective columns of memory cells, and a redundancy control circuit comprising defective-address storage means for storing addresses of the defective columns and activating respective redundancy columns when said defective columns are addressed, characterized in that said redundancy control circuit comprises second direct memory access test means activatable in a second test mode together with said first direct memory access test means for directly coupling memory elements of the defective-address storage means to respective second-level columns of the array, whereby said memory elements of the defective-address storage means can be directly coupled to output terminals of the memory device.

Thanks to the present invention, it is possible to test the memory elements wherein the defective addresses of the defective bit lines are to be stored by using the same direct memory access circuits normally provided in the memory devices to test the memory cells of the memory array. This allows a compact layout, because no overhead in the chip area is introduced.

BRIEF DESCRIPTION OF THE DRAWINGS

These and other features and advantages of the present invention will be made apparent from the following detailed description of a particular embodiment, described as a non-limiting example in the annexed drawings, wherein:

FIG. 7 is a schematic diagram of a circuit for generating column selection signals;

FIG. 8 schematically shows a circuit for generating selection signals of non-volatile memory registers of the redundancy control circuit.

DETAILED DESCRIPTION OF THE INVENTION

Figure 1:
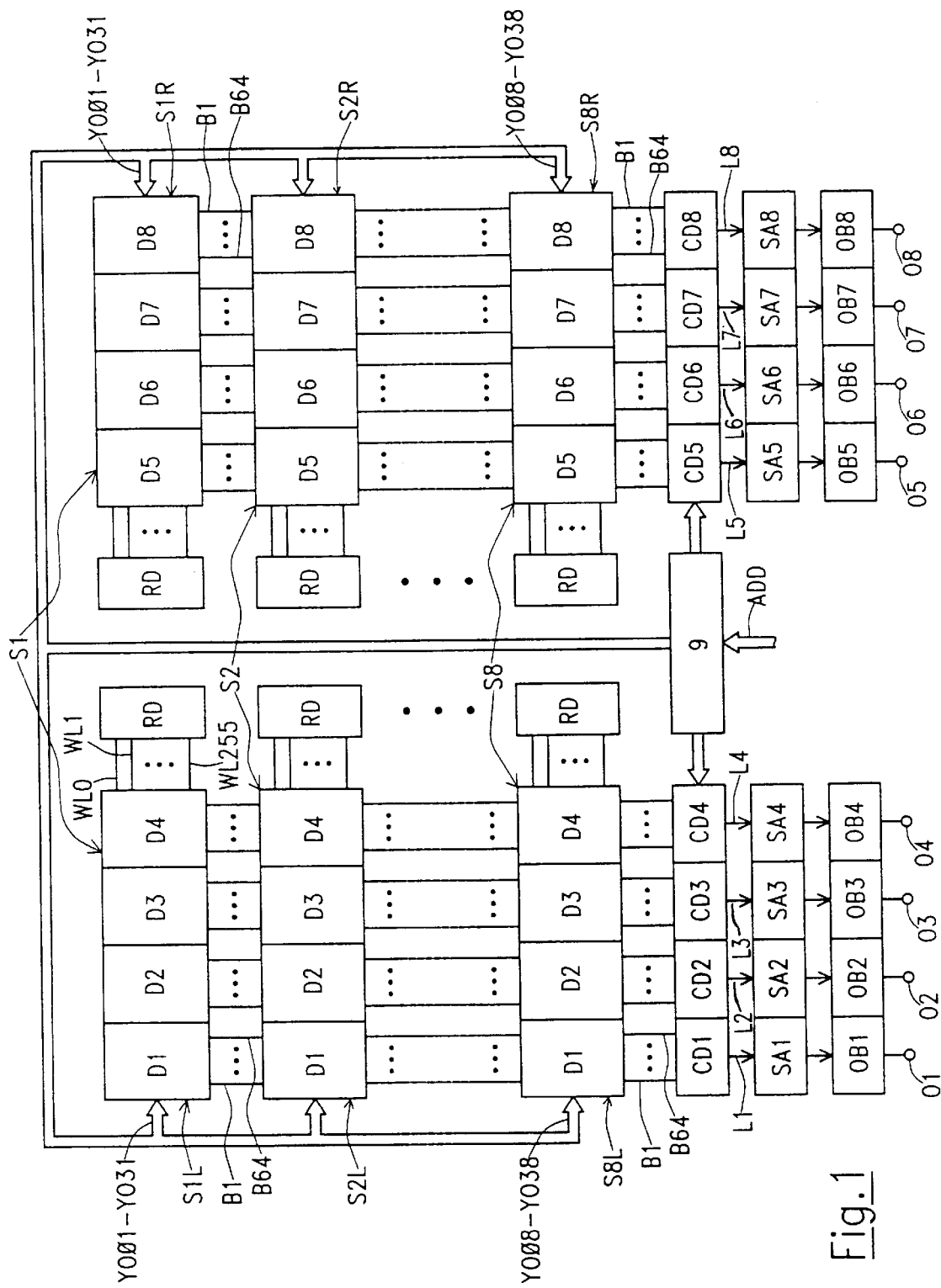
FIG. 1 is a schematic block diagram of a sectorized Flash EEPROM with redundancy.

Referring to FIG. 1, a sectorized Flash EEPROM is shown comprising a plurality (eight in the shown example) of independent, individually erasable memory sectors S1–S8. The memory sectors S1–S8 can have equal size, but they could as well have different sizes from each other. Supposing for example that the Flash EEPROM is a 4 Mbit device with eight output data lines (i.e., a 512 KByte memory) and that the memory sectors S1–S8 have equal size, each memory sector has a size of 512 Kbit.

The memory sectors S1–S8 are divided in two parts, namely a left side S1L–S8L and a right side S1R–S8R. As will be better explained in the following, each side of each memory sector includes 256 K memory cells located at the intersections of rows (word lines) WL0–WL255 and columns (bit lines). Associated with each side of each memory sector is a respective row decoder RD for selecting one word line among the 256 available.

Each memory sector S1–S8 is divided into eight portions D1–D8 of the same size (64 Kbit), each portion corresponding to the memory space reserved to a respective output data line of the memory device. The left side S1L–S8L of each memory sector includes the first four portions D1–D4, corresponding for example to the four least significant bits O1–O4 of the eight output data lines; the right side S1R–S8R of the memory sectors includes the remaining four portions D5–D8, corresponding to the four most significant bits O5–O8 of the eight output data lines.

Figure 2:
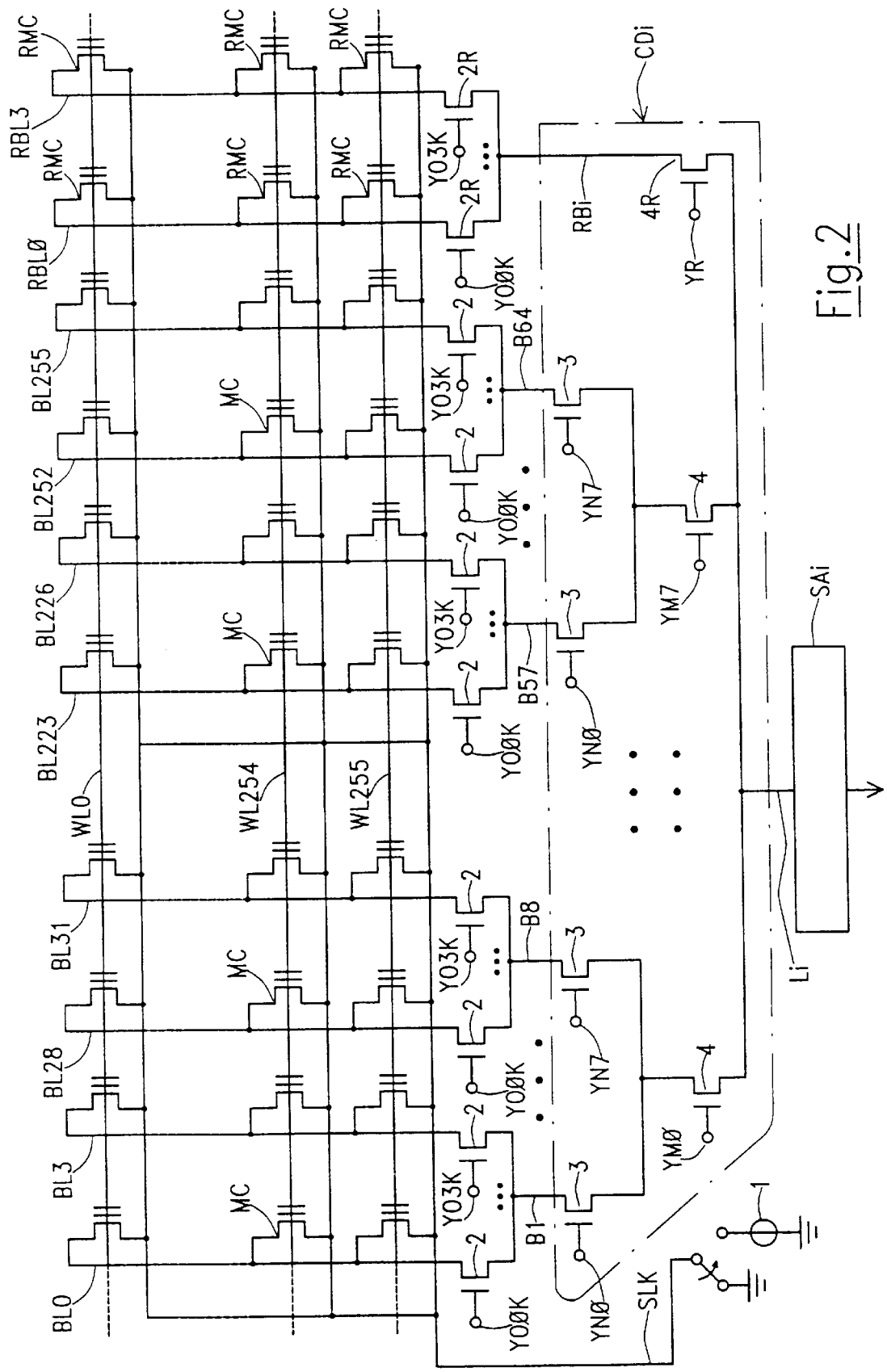
FIG. 2 is a schematic circuit diagram of a column decoding architecture of the Flash EEPROM of FIG. 1.

As visible in FIG. 2, showing in detail the structure of a portion Di (i=1 . . . 8) of a given memory sector Sk (k=1 . . . 8), each portion Di includes 256 bit lines BL0–BL255. The memory cells MC are represented by floating-gate MOS transistors each having a control-gate electrode connected to a respective word line (one among the 256 word lines WL0–WL255), a drain electrode connected to a respective bit line (one among the 256 bit lines BL0–BL255), and a source electrode connected in common with the source electrodes of all the other memory cells MC of the same memory sector Sk to a switchable source line SLk (which can be switched between ground and the output of an erase source voltage supply 1). Inside each portion Di, the bit lines BL0–BL255 are grouped together in groups of four, each group being coupled to a respective second-level bit line B1–B64. First-level selection transistors 2, driven by respective first-level selection signals YO0k–YO3k, allow the selection of one bit line BL0–BL255 inside each group, so that the selected bit line BL0–BL255 can be electrically connected to the respective second-level bit line B1–B64. As visible in FIG. 1, the second-level bit lines B1–B64 of a given portion Di of a given memory sector Sk are common to all the portions Di of the other memory sectors. An array of eight column decoders CDi (i=1 . . . 8) (a given column decoder CDi being associated to the portions Di of all the eight memory sectors S1–S8) allow the selection of one of the 64 second-level bit lines B1–B64, multiplexing the 64 second-level bit lines B1–B64 into a single line Li (i=1 . . . 8). As shown in FIG. 2, the second-level bit lines B1–B64 are grouped together in groups of eight. Each column decoder CDi comprises eight groups of eight second-level selection transistors 3, driven by second-level selection signals YN0–YN7 (common to all the memory sectors) and allowing the selection of one of the second-level bit lines B1–B64 within each group of eight, and eight third-level selection transistors 4, driven by third-level selection signals YM0–YM7 (also common to all the memory sectors) and allowing the selection of one of the eight groups of eight second-level bit lines B1–B64.

Each column decoder CDi supplies a respective sense amplifier SAi (i=1 . . . 8), and each sense amplifier SAi supplies in turn a respective output buffer OBi (i=1 . . . 8) which drives a respective output data line Oi (i=1 . . . 8).

The first-, second- and third-level selection signals YO0k–YO3k (k=1 . . . 8), YN0–YN7 and YM0–YM7 are generated by a decoding circuit 9 supplied with an address signal bus ADD. The generation of the first-, second- and third selection signals will be explained in further detail later on.

When the memory device is accessed in read or program mode, eight bit lines are simultaneously selected, one bit line for each one of the eight portions D1–D8 of the currently addressed memory sector.

As further shown in FIG. 2, associated with each portion Di of each memory sector Sk are four columns (redundancy bit lines RBL0–RBL3) of redundancy memory cells RMC, identical to the memory cells MC. Four first-level redundancy selection transistors 2R, driven by the four first-level redundancy selection signals YO0k–YO3k, allow the selection of one of the four redundancy bit lines RBL0–RBL3, electrically connecting the selected redundancy bit line to a second-level redundancy bit line RBi (i=1 . . . 8); the second-level redundancy bit line RBi of a given portion Di of a given memory sector is common to all the portions Di of the other memory sectors. In the column decoder CDi, a second-level redundancy selection transistor 4R, driven by a second-level redundancy selection signal YR (common to all the memory sectors), allows to electrically connect the second-level redundancy bit-line RBi to the sense amplifier SAi associated with the portion Di. Incidentally, it should be noted that in one embodiment, the redundancy memory cells RMC do not have their source electrodes connected to the common source line SLk of the memory sector Sk, to allow independent electrical erasing. In another embodiment, however, the source electrodes of the redundant memory cells RMC are connected to the common source line SLK.

Figure 3:
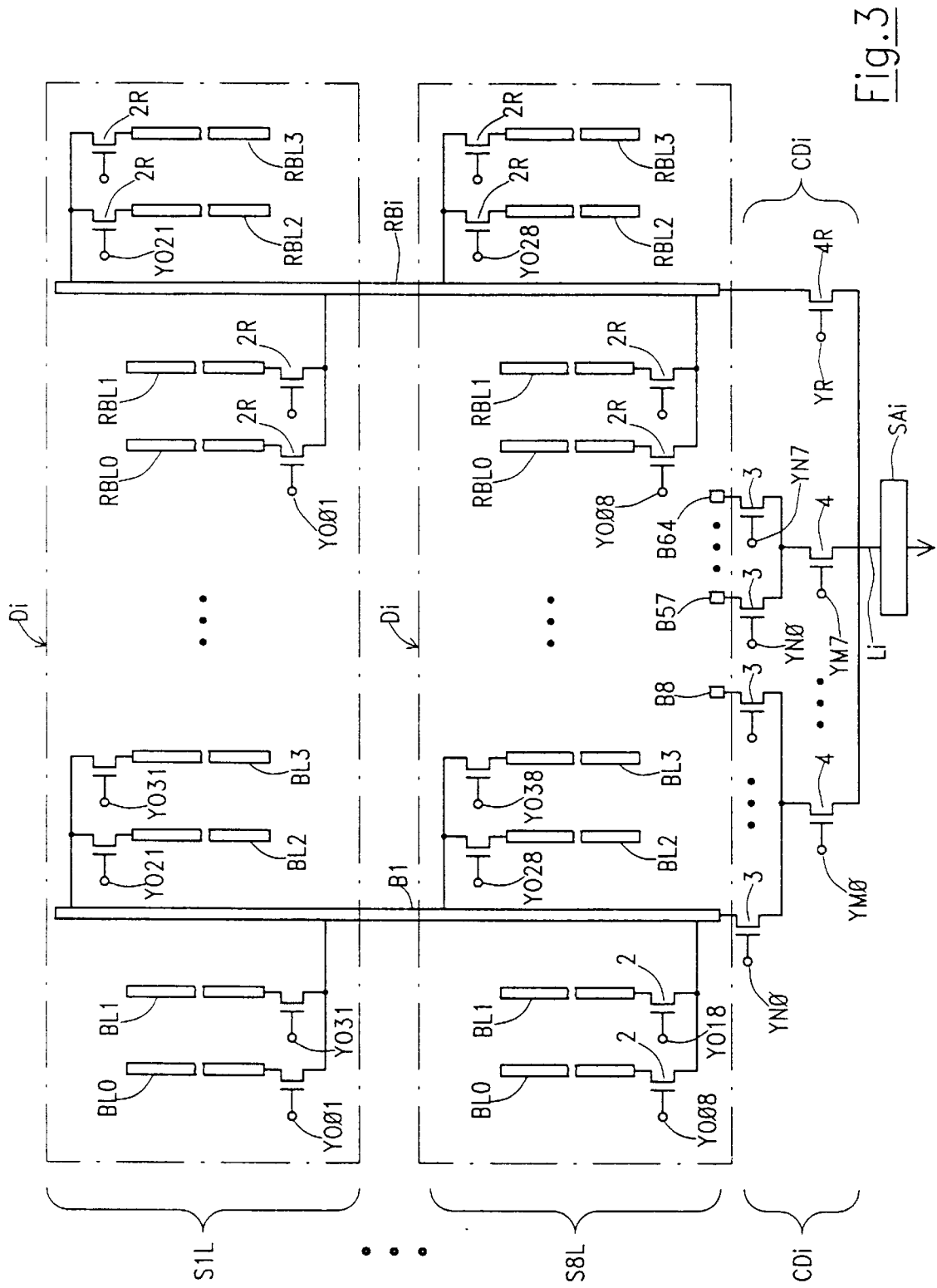
FIG. 3 shows the schematic physical structure of the column decoding architecture shown in FIG. 2.

FIG. 3 schematically shows the physical structure of the bit lines and second-level bit lines. Bit lines BL0–BL255 and redundancy bit lines RBL0–RBL3 are local to each portion Di (i.e., the bit lines and the redundancy bit lines of a given portion Di of a given sector are physically distinct from the bit lines and the redundancy bit lines of the portions Di of the other memory sectors), and are for example formed by means of strips of a first-level interconnection layer (for example, in a double metal layer manufacturing process, they are formed by strips of the first-level metal layer). The second-level bit lines B1–B64 and the second level redundancy bit line RBi of a given portion Di of a given memory sector are instead common to all the portions Di of the other memory sectors, and are for example formed by means of strips of a second-level interconnection layer (in a double metal layer process, they are formed by strips of the second-level metal layer).

Figure 4:
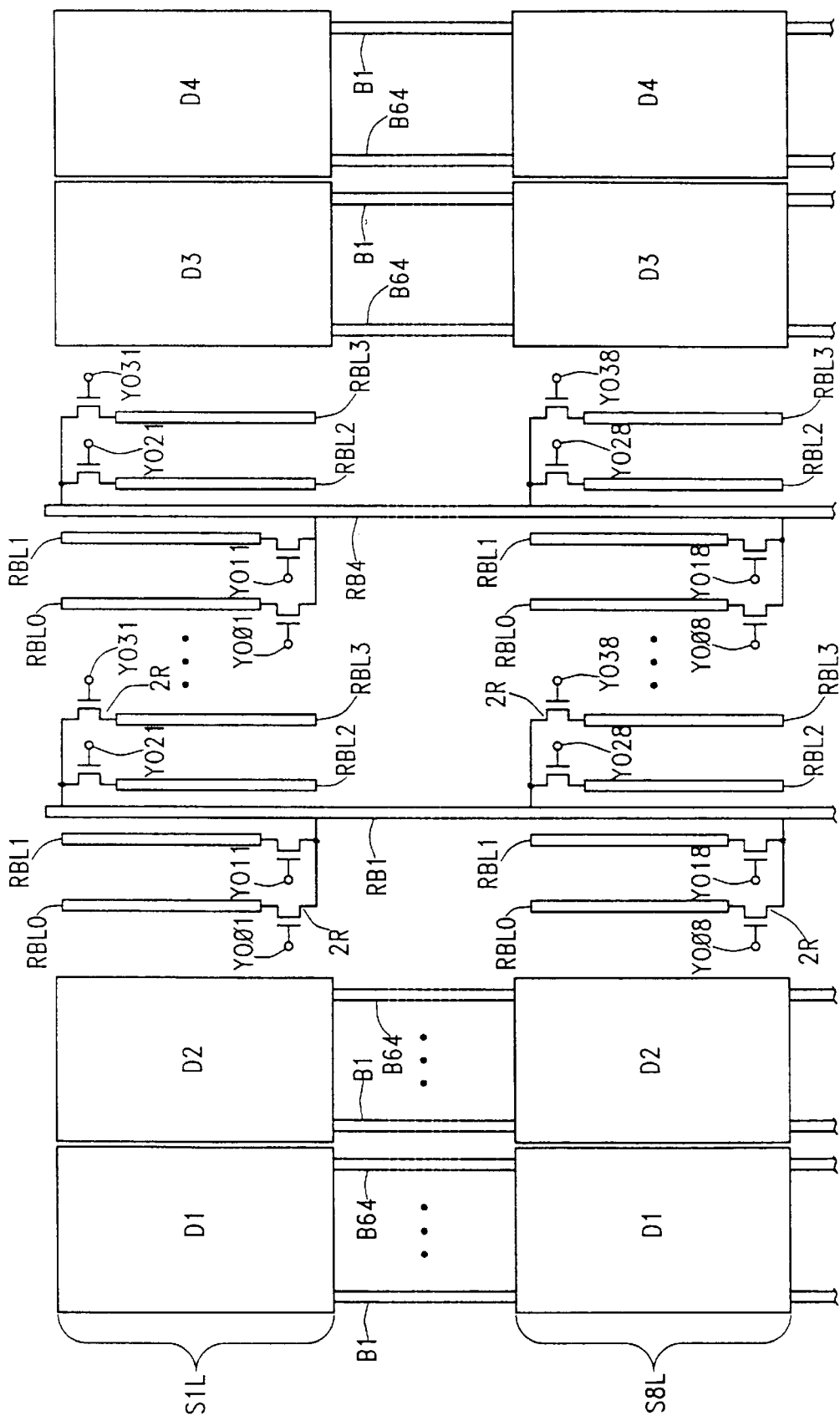
FIG. 4 is a schematic physical layout of a portion of the Flash EEPROM shown in FIG. 1.

FIG. 4 schematically illustrates the physical arrangement of the redundancy bit lines inside a memory sector. In this figure, only the left side of the memory sectors is shown, the right side being symmetrical. The sixteen redundancy bit lines (four local redundancy bit lines RBL0–RBL3 for each one of the four portions D1–D4 in the left side of the memory sectors) are located between the portions D2 and D3 of each memory sector S1–S8. In the overall, 256 redundancy bit lines are provided in the memory device.

Figure 5:
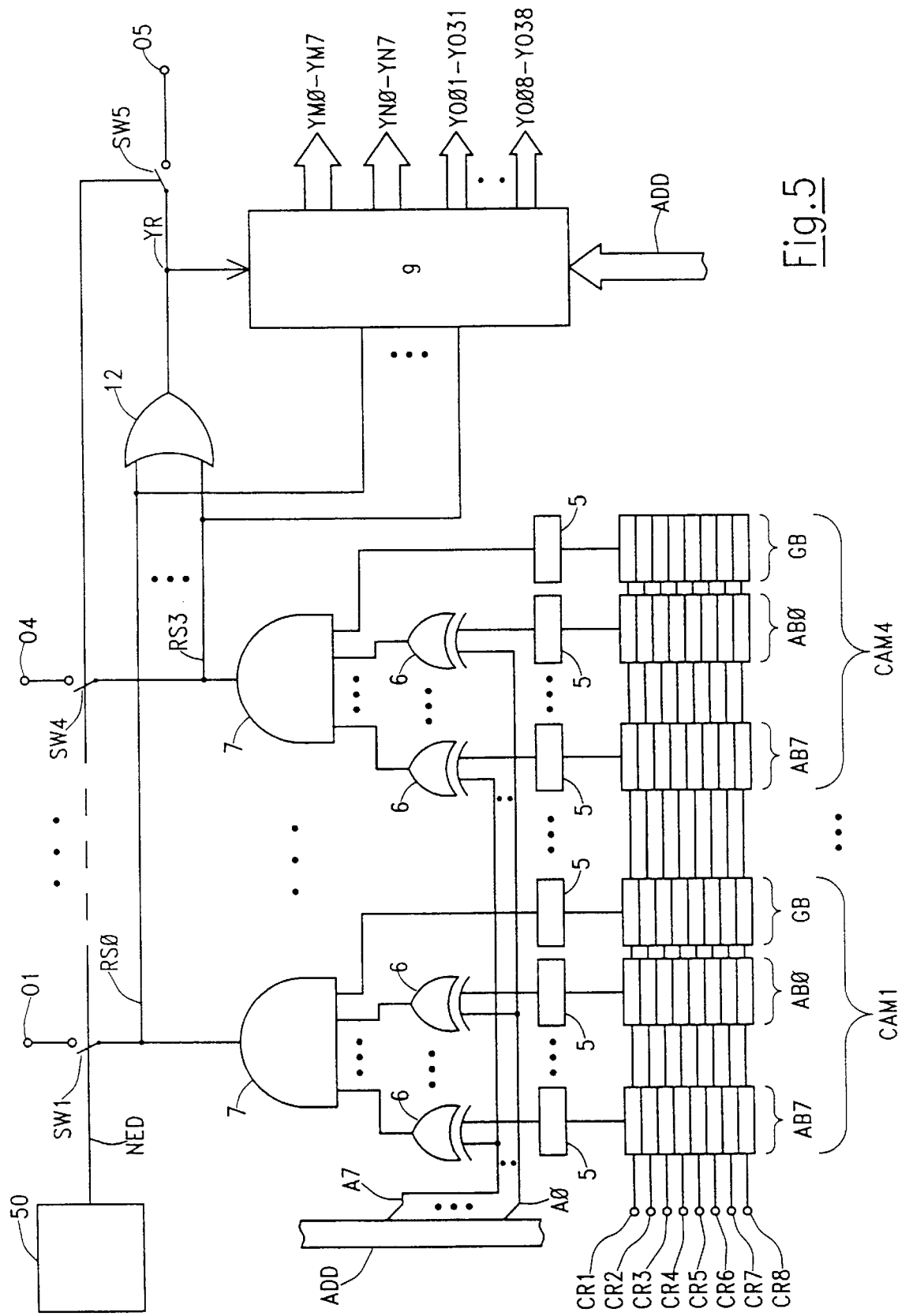
FIG. 5 shows a redundancy control circuit of the Flash EEPROM shown in FIG. 1.

FIG. 5 schematically shows a redundancy control circuit integrated in the Flash EEPROM. The circuit comprises a Content Addressable Memory (CAM) comprising four memory banks CAM1–CAM4. The first memory bank CAM1 is associated with the redundancy bit line RBL0 in each portion Di of each memory sector Sk; similarly, the second, third and fourth memory banks CAM2–CAM4 are associated with the redundancy bit lines RBL1–RBL3, respectively, in each portion Di of each memory sector Sk. Each memory bank CAM1–CAM4 comprises eight CAM rows (CAM memory locations), individually addressable by means of eight respective CAM row selection signals CR1–CR8. Each CAM row comprises nine memory elements: the first eight memory elements AB0–AB7 are capable of storing an eight-bit digital code corresponding to an address of a defective bit line among the 256 bit lines BL0–BL255 of a portion Di of memory sector, while the ninth memory element GB (so-called "guard bit") is programmed to signal that a defective bit line address is stored in the memory elements AB0–AB7. Each CAM row is associated to a respective memory sector. For example, the first CAM row of each memory bank CAM1–CAM4 is associated with the first memory sector S1, and so on. A given CAM row is read when the correspondent memory sector is addressed. In this way, if the currently addressed bit line of the currently addressed memory sector is a defective bit line, it is possible to substitute the defective bit line with a redundancy bit line belonging to the addressed memory sector. Bit lines belonging to other memory sectors but having the same address as the defective bit line are not replaced by redundancy bit lines. This permits to repair a higher number of defects.

Each one of the nine memory elements AB0–AB7 and GB in each memory bank CAM1–CAM4 is associated with a respective sensing circuit 5 for reading the content of the respective memory element; more precisely, all the memory elements AB0 of the eight CAM rows of a given memory bank are associated with a unique sensing circuit 5, and the same holds true for the other memory elements AB1–AB7 and GB. The output of each sensing circuit 5, except from the output of the sensing circuit 5 associated with the guard bits GB, supplies a respective two-inputs EXOR gate 6 whose other input is a respective address signal A0–A7 of the address signal bus ADD. A0–A7 carry the current column address signal. Each EXOR gate 6 compares the content of the respective memory element AB0–AB7 of the associated CAM memory bank with the logic state of the respective one of the column address signals A0–A7. The outputs of the EXOR gates 6 and the output of the sensing circuit 5 associated to the guard bit GB are supplied to a nine-input AND gate 7 whose output RS0–RS3 supplies, together with the outputs of the other three AND gates 7 associated to the remaining three CAM memory banks CAM2 . . . CAM4, the column decoding circuit 9 and a four-inputs OR gate 12. An output of the OR gate 12 forms the second-level redundancy selection signal YR, and also supplies the column decoding circuit 9. The output of a given AND gate 7 is high only when the digital code stored in the memory elements AB0–AB7 of the selected CAM row of the associated CAM memory bank coincides with the current logic configuration of the column address signals A0–A7, and when the guard bit GB of the selected CAM row is programmed.

For testing purposes, the outputs RS0–RS3 of AND gates 7 also drive directly, through respective switches SW1–SW4, the output data lines O1–O4. Switches SW1–SW4 are controlled by a test signal NED, generated by a control logic 50 internal to the memory device, which is activated in particular test conditions to directly connect the outputs RS0–RS3 to the respective output data lines O1–O4. The signal NED also controls a further switch SW5 which, when closed, directly connects the output YR of OR gate 12 to the output data line O5. In this way, it is possible to test if a given address supplied to the memory device corresponds to a defective bit line in the currently addressed memory sector: in the affirmative case, at the output data line O5 a high logic level will appear; at the same time, by just controlling the logic levels at the output data lines O1–O4, it is possible to determine which one of the redundancy bit lines RBL0–RBL3 has been used to replace the defective bit line. By successively addressing all the eight memory sectors, the eight CAM rows CR1–CR8 are successively selected, so that a complete knowledge of the number of defective bit lines can be achieved, as well as of the redundancy bit lines used to replace the defective bit lines.

Figure 6:
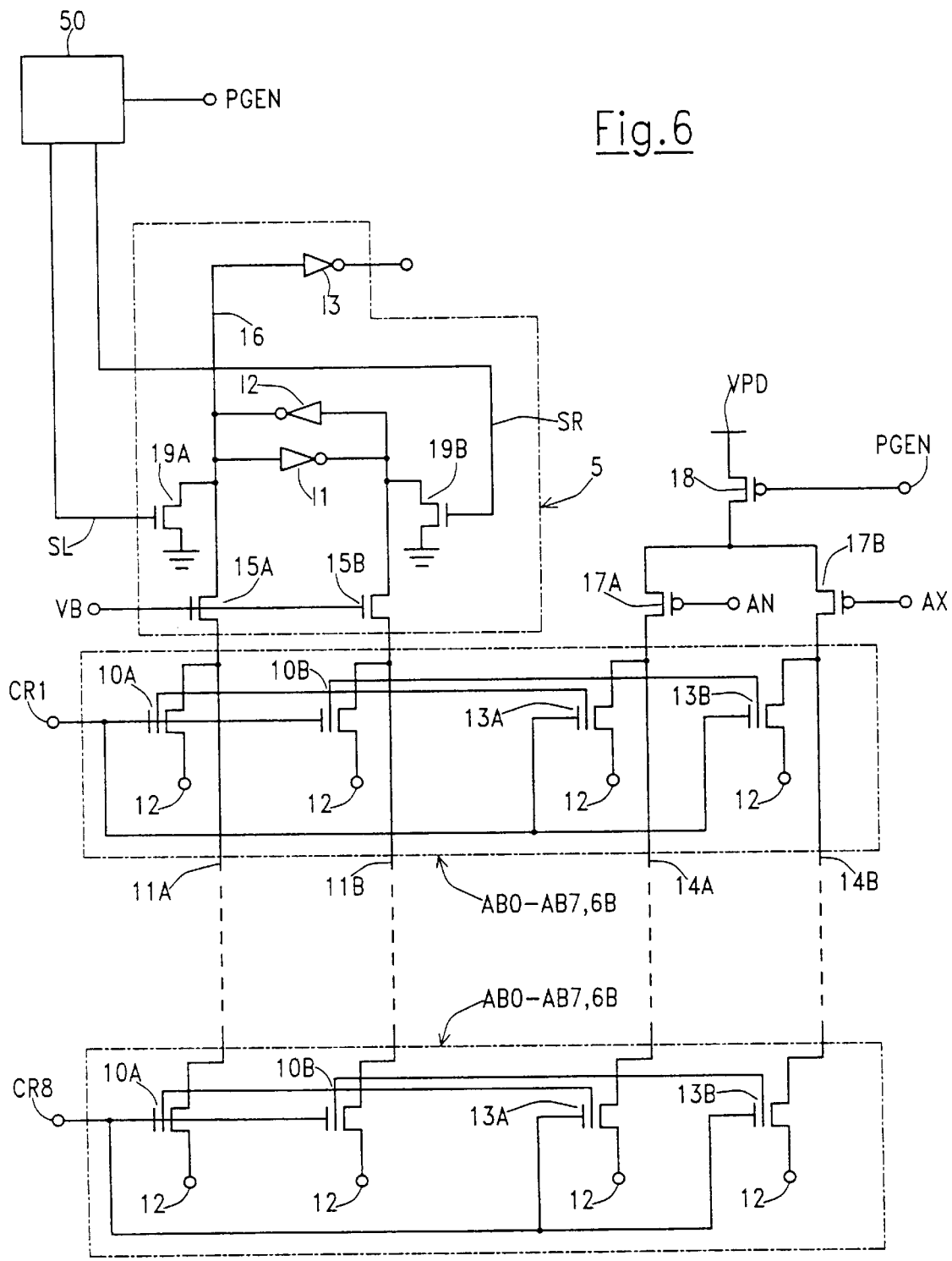
FIG. 6 shows a detail of the redundancy control circuit of FIG. 5.

FIG. 6 shows in detail the structure of the CAM memory elements AB0–AB7 or GB, and of the respective sensing circuit 5. As visible, each CAM memory element AB0–AB7 or GB comprises two memory cells 10A, 10B (schematized as floating-gate MOS transistors) having respective control inputs supplied with a respective one of the CAM row selection signals CR1–CR8; drain electrodes of the two memory cells 10A, 10B are connected to respective read lines 11A, 11B common to the memory elements of the same column of the other CAM rows; source electrodes of the memory cells 10A, 10B are connected to a common source line 12 common to all the CAM memory elements AB0–AB7 and GB of the CAM memory. Each CAM memory element also comprises two further floating-gate MOS transistors 13A, 13B with control gates connected to the respective CAM row selection signal, source connected to the common source line 12 and drain connected to respective programming lines 14A, 14B common to the other CAM rows. Memory cell 10A and floating-gate MOSFET 13A, and similarly memory cell 10B and floating gate MOS transistor 13B, have floating-gates short-circuited to each other. Each one of memory cells 10A, 10B is preferably formed by four floating-gate MOS transistors (identical to the floating-gate MOS transistors 13A, 13B and, more generally, to the floating-gate MOS transistors forming the memory cells MC of the memory array) connected in parallel: this allows a high sensing current without increasing the programming current, because the hot-electron current generated in the channel of, e.g., 13A programs all the five floating-gate MOS transistors 10A and 13A simultaneously; the programming current required to program the memory cell is substantially equal to that of a single floating-gate MOS transistor, but the sensing current is approximately equal to four times the sensing current of a single floating-gate MOS transistor in the same biasing conditions.

Read lines 11A, 11B are coupled, through respective voltage-limiting transistors 15A, 15B, to respective inputs of a bistable latch comprising two inverters I1, I2. An output 16 of the latch is supplied to an inverter I3, and the output of I3 is supplied to the respective EXOR gate 6 or, in the case of the guard bits GB, directly to the respective AND gate 7. The gate electrodes of voltage-limiting transistors 15A, 15B are biased by a bias voltage VB of approximately 2 V which limits the voltage on the drains of the memory cells 10A, 10B at approximately 1 V, to prevent soft-writing errors. Programming lines 14A, 14B are coupled to respective P-channel MOSFETs 17A, 17B respectively controlled by complementary signals AN, AX wherein for the CAM memory elements AB0–AB7 AX is one of the address signals A0–A7, and AN is the logic complement of said signal. The sources of MOSFETs 17A, 17B are connected to a P-channel MOSFET 18 supplied by a programming voltage supply VPD and controlled by a program enable signal PGEN, also generated by the control logic 50. The source line 12, similarly to the common source lines Sk of the memory sectors, can be switched between ground and a positive erase voltage, to allow electrical erasure of the floating-gate MOS transistors of the CAM memory.

Also visible in FIG. 6 are two N-channel MOSFETs 19A, 19B each one connected between a respective one of the read lines 11A, 11B and ground. These MOSFETs are controlled by two signals SL, SR generated by the control logic 50, and are useful to set the bistable latch formed by inverters I1, I2 in two opposite conditions for testing purposes, as will be described in detail later on.

FIG. 7 schematically shows the structure of the column decoding circuit 9. The circuit comprises a first decoder 20 supplied with the column address signals A5–A7 and generating the eight third-level selection signals YM0–YM7; depending on the particular logic configuration of the address signals A5–A7, only one of the third-level selection signals YM0–YM7 is activated. The first decoder 20 is also supplied with the signal YR to inhibit the activation of anyone of the third-level selection signals YM0–YM7, independently of the state of the address signals A5–A7, when the signal YR is active. A second decoder 21 is supplied with the column address signals A2–A4 and generates the eight second-level selection signals YN0–YN7. Only one of these signals YN0–YN7 is activated, depending on the state of the address signals A2–A4. A third decoder 22 is supplied with the remaining column address signals A0, A1 and with eight memory sector selection signals SS1–SS8, and generates the eight groups of first-level selection signals Y00k–Y03k (k=1 . . . 8). The sector selection signals SS1–SS8 are generated by another decoder 23, also supplied by the address signal bus ADD, and according to the particular logic configuration of the address signals ADD one of the sector selection signals SSk (k=1 . . . 8) is activated. The activation of a given one of the signals SSk allows the activation of a respective one of the four signals Y00k–Y03k of the group k, according to the configuration of the address signals A0, A1; all the other first-level selection signals of the other groups Y00k–Y03k are not activated. The third decoder 22 is also supplied with the signal YR and with the redundancy selection signals RS0–RS3. When the signal YR is active, the activation of one of the first-level selection signals Y00k–Y03k corresponding to the selected sector k does not depend on the address signals A0, A1, but on the signals RS0–RS3, respectively. The third decoder 22 is also supplied by a signal DMAR generated by the control logic 50. The function of signal DMAR will be explained later on. For the moment it is sufficient to say that when the signal DMAR is active, all the first-level selection signals Y0k0–Y0k3 are deactivated.

It is to be noted that when in a given portion Di of a given memory sector a defective bit line is replaced by one of the four redundancy bit lines RBL0–RBL3 associated with said portion Di, the same substitution takes place for all the bit lines belonging to the other portions of the memory sector but having the same address of the defective bit line. In other words, redundancy of a defective bit line is not independent from the portion Di in which the defective bit line is found.

FIG. 8 schematically shows a circuit for generating the CAM row selection signals CR1–CR8. Sector selection signals SS1–SS8, each one activated by a particular configuration of the address signals of the memory device, supply respective driver circuits DC1–DC8 which provide, at their outputs, the CAM row selection signals CR1–CR8. In normal operation of the memory device, the drivers circuits DC1–DC8 are supplied by a voltage UGV provided by a voltage regulator 30. The voltage UGV is kept lower than the value of the external power supply VCC of the memory device (for example at 4.5 V) to avoid unnecessary electric stress of the floating-gate MOS transistors of the CAM memory elements. However, a switch SW7, controlled by the control logic 50 allows to switch the supply of the driver circuits DC1–DC8 to the external voltage supply VCC. This is useful in particular test conditions which will be explained later on.

Figure 9:
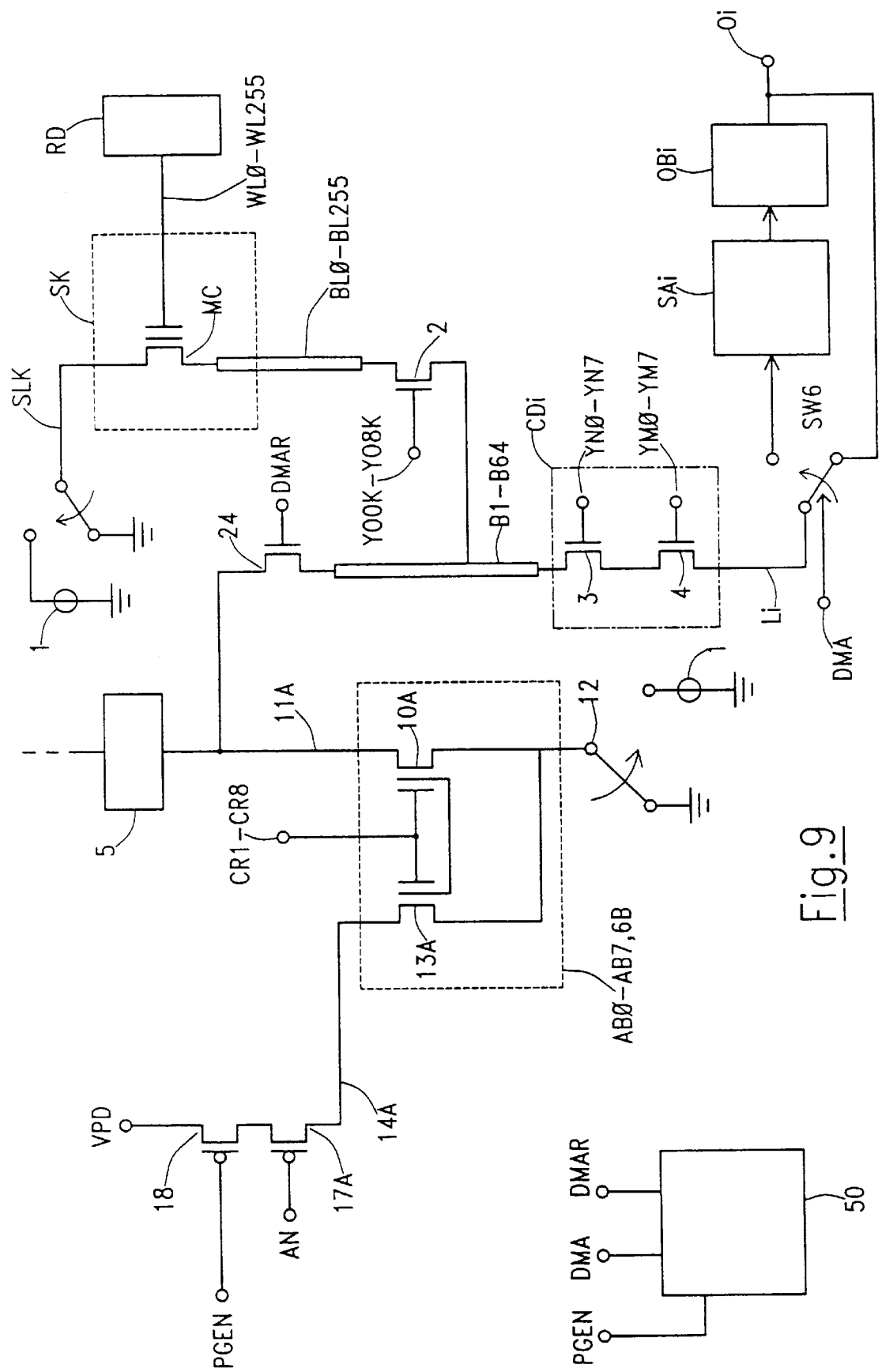
FIG. 9 schematically shows a physical and circuital arrangement according to the present invention for testing the redundancy control circuit.

FIG. 9 is a schematic diagram showing the circuit and physical layout arrangement used to provide some testing features for the redundancy control circuit. In the drawing, one of the CAM memory elements AB0–AB7, GB of the CAM memory is schematically shown. Only one of the two memory cells 10A, 10B, and the associated floating-gate MOS transistor 13A, 13B, are shown, but an identical arrangement is provided for the second memory cell of the CAM memory element. The read line 11A shown in FIG. 6 is not only connected to the respective sensing circuit 5, but it is also connected, through a respective N-channel MOSFET 24, to one of the second-level bit lines B1–B64 of the memory array. MOSFET 24 is controlled by the signal DMAR, generated by the control logic 50. As explained in connection with FIG. 6, all the memory cells 10A of the CAM memory elements AB0–AB7, GB belonging to a same column of a same CAM memory bank are coupled to the same read line 11A. The memory cells 10B will be connected, through respective MOSFETs 24, to another second-level bit line B1–B64 of the memory array. The signal DMAR is common to all the memory elements of the CAM memory. In this way, the drain electrodes of all the memory cells 10A, 10B of all the CAM memory elements AB0–AB7, GB of the CAM memory can be coupled to respective second-level bit lines B1–B64 of the memory array. From a physical layout point of view, this is made possible because the memory cells of the CAM memory being identical to the memory cells MC in the memory array, the former have the same pitch as the latter.

In FIG. 9 a switch SW6 is also shown which allows to selectively connect the line Li at the output of the column decoder CDi either to the respective sense amplifier SAi or, directly, to the output data line Oi. Switch SW6 is controlled by a signal DMA generated by the control logic 50 and schematizes the so-called "Direct Memory Access (DMA)" circuits normally provided in memory devices for testing purpose. When the memory device is put in DMA test mode, the output line Li of the column decoder CDi is directly connected to the respective output data line Oi. It is thus possible to measure the current drained by the addressed memory cell MC in the memory array. Varying the external supply of the memory device it is thus possible to determine the current-voltage characteristic of the addressed memory cell MC. Similar switches SW6 are provided at the output of all the column decoders CDi shown in FIG. 1.

Thanks to the arrangement of FIG. 9, DMA test mode of the CAM memory elements can be performed using the same circuits provided for DMA test of the memory cells MC of the memory array. It is in fact sufficient to activate DMA test mode (signal DMA active) and to activate the DMAR signal. In this way, no one of the bit lines BL0–BL255 is connected to the second-level bit line B1–B64(because the first-level selection signals Y00k–Y03k are all deactivated), and the read line 11A, 11B of the CAM memory element AB0–AB7, GB is instead connected, through MOSFET 24, to the second-level bit line B1–B64, and thus to the output data line Oi. Selection of the memory cell 10A, 10B to test is achieved by selecting one of the CAM memory rows, and selecting (by means of transistors 3 and 4) the second-level bit line. It is thus possible to measure the current drained by the memory cell 10A, 10B (which, as already said, is preferably formed by a parallel of four floating-gate MOS transistors).

The use of the same DMA circuits provided for the DMA test of the memory cells MC in the memory array allows to have a compact layout.

Another important test feature is the capability of verifying the threshold voltages of the CAM memory cells 10A, 10B of the CAM memory elements AB0–AB7, GB both in the erased and programmed states.

Let us first assume that the CAM memory has been electrically erased (this is the typical condition at the beginning of the in-factory testing of the memory device, because as a preliminary step all the memory cells MC of the memory array, all the redundancy memory cells RMC and all the memory cells of the CAM memory are electrically erased). It is useful to verify the threshold voltages of the memory cells of the CAM memory to ascertain that all the memory cells have been actually erased. This kind of test is performed addressing one memory sector Sk at a time, to select one of the eight CAM rows at a time. The control logic 50 switches switch SW7 to connect the supply of driver circuits DC1–DC8 to the external voltage supply VCC. In this way, the CAM row selection signal of the selected CAM row is put at the VCC voltage, instead of the UGV (4.5 V) voltage. In order to verify the threshold voltage of the memory cells 10A of the CAM memory elements belonging to the selected CAM row, each one of the bistable latches formed by inverters I1, I2 in the sensing circuits 5 is set, by means of MOSFETs 19A and 19B, to an initial condition in which the read lines 11A are set high and the read lines 11B are set low then VCC is progressively increased. As long as VCC is lower than the threshold voltage of the memory cells 10A, read lines 11A remain high, but when VCC reaches the threshold voltage of the memory cells 10A read lines 11A are pulled to ground; if the memory device is supplied with an address such that A0=. . . =A7=1, and if the signal NED is activated by the control logic 50, a transition will be detected at the output lines O1–O4, indicating that the threshold voltage of the memory cells 10A of the CAM memory elements belonging to the selected CAM row has been reached. To verify the threshold voltage of the memory cells 10B, each one of the bistable latches I1, I2 is set by means of MOSFETs 19A, 19B in the opposite condition, in which read lines 11B are set high and read lines 11A are set low VCC is then progressively increased. When VCC reaches the threshold voltage of the memory cells 10B, the latter turn on and drain current. Lines 11B go low but lines 11A remain low and no transition takes place at the output data lines O1–O5. The reaching of the threshold voltage of memory cells 10B can, however, be detected by measuring a significant increase in current drained by the power supply VCC, because conductive paths are created from VCC to ground through the pull-up transistors of inverters I1, I2 and the memory cells 10A, 10B.

Testing of the programmed-state threshold voltages of the memory cells 10A, 10B after an electrical programming pulse can be accomplished in a similar way. For example, to verify the programmed-state threshold voltage of the cells 10A of the CAM memory elements belonging to a selected CAM row, the bistable latches I1, I2 are set by means of MOSFETs 19A, 19B in an initial condition in which read lines 11A are set high and lines 11B are set low. VCC is then progressively increased. As long as VCC is lower than the programmed-state threshold voltage of cells 10A, lines 11A remain high, but when VCC reaches the programmed-state threshold voltage of cells 10A lines 11A are pulled to ground, the bistable latches switch, and a transition can be detected at the output data lines O1–O4. To verify the programmed-state threshold voltage of memory cells 10B, the bistable latches I1, I2 are set in the opposite condition, VCC is progressively increased, and the current drained from the external supply VCC is measured. When this current shows a significant increase, VCC has reached the threshold voltage of memory cells 10B.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A memory circuit, comprising:

data terminals;

matrix memory cells that are arranged in matrix columns;

matrix bit lines that are each coupled to the matrix cells in a respective matrix column;

matrix switches that are each respectively coupled between a matrix bit line and a data terminal;

redundancy memory cells that are arranged in redundancy columns;

redundancy bit lines that are each coupled to the redundancy cells in a respective redundancy column;

redundancy switches that are each respectively coupled between a redundancy bit line and a data terminal;

redundancy address registers each having an output terminal that is coupled to a respective one of the redundancy switches, the redundancy address registers each including respective storage elements;

first test switches each respectively coupled between one of the storage elements and a matrix bit line; and a control circuit coupled to the matrix, redundancy, and test switches.

2. The memory circuit of claim 1, further comprising comparison circuits each having first input terminals coupled to receive an address signal, second input terminals coupled to the storage elements of a respective redundancy address register, and an output terminal coupled to a respective one of the redundancy switches.

3. The memory circuit of claim 1, further comprising:

comparison circuits each having first input terminals coupled to receive an address signal, second input terminals coupled to the storage elements of a respective redundancy address register, and an output terminal coupled to a respective one of the redundancy switches; and second test switches each respectively coupled between the output terminal of a comparison circuit and a data terminal.

4. The memory circuit of claim 1, further comprising:

each of the storage elements comprising a nonvolatile memory cell having a control terminal; and a variable-voltage generator having an output terminal coupled to the control terminals of the nonvolatile memory cells.

5. A method for testing a nonvolatile storage element in a memory circuit, the storage element forming a component of a redundancy address register and used to store an address of a defective matrix memory cell to which a redundancy memory cell is mapped, the method comprising:

coupling the storage element to a matrix bit line;

coupling the bit line to an output terminal of the memory circuit;

activating the storage element; and measuring at the output terminal a first current flowing through the storage element.

6. The method of claim 5, further comprising:

programming the storage element with a different state; and measuring at the output terminal a second current flowing through the storage element.

7. A method for testing a threshold voltage of a nonvolatile storage element in a memory circuit, the storage element used to store an address of a defective matrix memory cell to which a redundancy memory cell is mapped, the method comprising:

charging a bit line to a first bit-line logic level, the bit line coupled to the storage element;

comparing the logic level on the bit line with a test logic level to generate a first comparison logic level on an output terminal of the memory circuit;

driving the storage element with a drive signal having an initial signal level that deactivates the storage element;

gradually varying the drive signal to a voltage level that causes the storage element to drive a second bit-line logic level onto the bit line;

toggling the first comparison logic level to a second comparison logic level in response to the second bit-line logic level; and equating a first threshold voltage of the storage element with the voltage level of the drive signal when the first comparison logic level toggles to the second comparison logic level.

8. The method of claim 7 wherein the comparing comprises XORing the logic level on the bit line with the test logic level.

9. The method of claim 7, further comprising:

changing a programmed state of the storage element;

performing the charging, comparing, driving, varying, and toggling; and equating a second threshold voltage with the voltage level of the drive signal when the first comparison logic level toggles to the second comparison logic level.

10. A method for testing a threshold voltage of a nonvolatile storage element in a memory circuit, the storage element used to store an address of a defective matrix memory cell to which a redundancy memory cell is mapped, the method comprising:

charging a bit line to a first bit-line logic level, the bit line coupled to the storage element;

monitoring a current supplied by a power source to the bit line;

driving the storage element with a drive signal having an initial voltage level that causes the storage element to draw an initial current from the power source;

gradually varying the drive signal to a voltage level that causes the storage element to draw from the power source a current that is significantly different than the initial current; and equating a first threshold voltage with the voltage level of the drive signal when the power source first supplies the different current.

11. The method of claim 10, further comprising:

programming the storage element to a different state;

performing the charging, monitoring, driving, and varying; and equating a second threshold voltage with the voltage level of the drive signal when the power source first supplies the different current.

12. Electrically erasable and programmable non-volatile memory device, comprising at least one memory sector comprising an array of memory cells arranged in rows and first-level columns, the first-level columns being grouped together in groups of first-level columns each coupled to a respective second-level column, first-level selection means for selectively coupling one first-level column for each group to the respective second-level column, second-level selection means for selecting one of the second-level columns, first direct memory access test means activatable in a first test mode for directly coupling a selected memory cell of the array to a respective output terminal of the memory device, redundancy columns of redundancy memory cells for replacing defective columns of memory cells, and a redundancy control circuit comprising defective-address storage means for storing addresses of the defective columns and selecting respective redundancy columns when said defective columns are addressed, wherein said redundancy control circuit comprises second direct memory access test means activatable in a second test mode together with said first direct memory access test means for directly coupling memory elements of the defective-address storage means to respective second-level columns of the array, whereby said memory elements of the defective-address storage means can be directly coupled to output terminals of the memory device.

13. Memory device according to claim 12 wherein said second test mode said first-level selection means are deactivated.

14. Memory device according to claim 12 wherein said redundancy control circuit comprises comparison means for comparing an information content of said defective-address storage means with a current column address supplied to the memory device for determining if said current column address is a defective address, said comparison means activating redundancy column selection signals which activate redundancy column selection means for selecting a redundancy column in substitution of a defective column.

15. Memory device according to claim 14 wherein said redundancy control circuit comprises first test means activatable in a third test mode for directly supplying said redundancy column selection signals to respective output terminals of the memory device.

16. Memory device according to claim 15 wherein each memory element of the defective-address storage means comprises two electrically erasable and programmable memory cells suitable to be programmed in complementary states.

17. Memory device according to claim 16 wherein said comparison means comprises a plurality of sensing means each one associated with a respective memory element of the defective-address storage means for sensing an information content of said memory element.

18. Memory device according to claim 17 wherein each one of said sensing means comprises a bistable latch suitable to be set in two complementary logic states according to the programming state of said two memory cells of the associated memory element.

19. Memory device according to claim 18 wherein each one of said sensing means comprises second test means activatable in a fourth test mode for setting said bistable latch in either one or the other of said two complementary logic states, the redundancy control circuit comprising fifth test means activatable in said fourth test mode for supplying control inputs of said memory cells of the memory elements of the defective-address storage means with an externally-controlled potential.

* * * * *